United States Patent

Wayman

[15] 3,675,235

[45] July 4, 1972

[54] READ-OUT CIRCUITS FOR ELECTRICAL POSITION-ENCODERS

[72] Inventor: Cecil John Wayman, Stanmore, England

[73] Assignee: The General Electric Company Limited, London, England

[22] Filed: Aug. 11, 1970

[21] Appl. No.: 62,847

[52] U.S. Cl. ..........340/347 P
[51] Int. Cl. ..........G08c 9/00
[58] Field of Search ..........340/347 P

[56] References Cited

UNITED STATES PATENTS

| | | | |
|---|---|---|---|
| 3,099,003 | 7/1963 | Spaulding | 340/347 P |
| 3,286,252 | 11/1966 | Bose | 340/347 P |
| 3,562,739 | 2/1971 | Frank | 340/347 P |
| 3,553,683 | 1/1971 | Simoneau | 340/347 P |
| 3,471,850 | 10/1969 | Kristy | 340/347 P |
| 3,487,460 | 12/1969 | Wheeler | 340/347 P |
| 3,257,656 | 6/1966 | Gotz | 340/347 P |

*Primary Examiner*—Maynard R. Wilbur
*Assistant Examiner*—Jeremiah Glassman
*Attorney*—Kirschstein, Kirschstein, Ottinger & Frank

[57] ABSTRACT

A read-out circuit for a digital position encoder which reads directly in, say, a reflected binary code, and which is required to read in, say, a decimalized binary code. The direct read-out signals are biased in various ways e.g. by adding a fraction of one to another, and by simple d.c. biasing, so as to produce final output signals which have a basic digital cycle of other than the four-unit cycle of a reflected binary code, e.g. a 10-unit cycle.

7 Claims, 3 Drawing Figures

INVENTOR

CECIL JOHN WAYMAN

BY

ATTORNEYS

INVENTOR
CECIL JOHN WAYMAN
BY

ATTORNEYS

PATENTED JUL 4 1972

3,675,235

SHEET 3 OF 3

INVENTOR
Cecil John Wayman
BY
Kurtlen, Kurtlen, Offe & Frank
ATTORNEYS

READ-OUT CIRCUITS FOR ELECTRICAL POSITION-ENCODERS

This invention relates to read-out circuits for electrical position-encoders and particularly, although not exclusively, to code-conversion read-out circuits.

Electrical position encoders are known in which there are two relatively movable parts on one of which there are a plurality of electrical windings the magnetic induction between the windings being varied by relative movement of the two parts. The sense and magnitude of the coupling between a primary one of the windings and each of the others varies throughout the total range of relative positions of the two parts, which range is commonly a cycle of revolution. The variation of coupling between the primary winding and each of the others (the secondaries) is different in such a way that when an oscillatory or pulse signal is applied to the primary winding the magnitudes and senses of the signals induced in the secondary windings are together characteristic of the particular relative position of the two parts, or, if one part is used as a reference and the other part is fixed with respect to a movable member whose position is to be determined, characteristic of the position of the movable member.

Such an encoder features in various patents owned by the present Applicants, for example U.S. Pat. Nos. 3,099,830 and 3,197,758.

The present invention is particularly applicable to such encoders but will also be suitable for other encoders having similar outputs.

It is common for the above encoders to produce, say, five binary digital output signals which can together resolve, that is, discriminate between, 32 adjacent ranges of position. In a rotary encoder the 32 ranges will commonly occupy one revolution, in which case each range is 11.25°. Clearly, because the significant feature of each output signal is its sense, for which there are two possibilities, the most straightforward output code which can be obtained is a binary code, with the result that the number of adjacent ranges which can be distinguished is a power of two, and in the above example, 32.

It may however, happen that, given a particular standard encoder capable of discriminating between, say, 32 adjacent ranges, a total range is required to be encoded which, divided into 32 sub-ranges, or sections, does not give transitions at units of interest. To put it another way, the unit of interest may not be 132 part, or any integral number of such parts, of the total range.

One object of the present invention is therefore to provide a read-out circuit for an electrical position encoder which circuit will perform a code conversion to provide one having a desired unit value.

According to the present invention, in a read-out circuit for an electrical position encoder of the kind which resolves a plurality of adjacent ranges of position of a movable member and from which is derived a plurality of position responsive signals each of said signals having a value according to which of a number of groups of said ranges of position said movable member lies within, the grouping of said ranges being different for each position responsive signal so that the combination of position responsive signal values at any time is characteristic, according to a first position code, of the particular one of the plurality of ranges of position that is occupied by said member at that time, the circuit comprises biassing means in respect of at least one of said position responsive signals which biassing means is arranged to vary the correspondence between grouping and signal-value so that the combination of biassed and unbiassed (if any) position responsive signals provides a second position code according to which the total positional extent of said plurality of adjacent ranges of position is resolved in a different number of adjacent ranges.

Where the position responsive signal values have a binary, mark/space correspondence with two sets of alternate groups of ranges, the biassing means may be effective to vary the mark/space ratio of the respective position responsive signal and thus vary the grouping of the ranges which correspond to the values of that signal.

One or more of the biassing means may be arranged to provide a bias signal for its respective position responsive signal which bias signal is derived from another position responsive signal.

In use of the circuit as a code conversion circuit, the first position code may be a reflected binary code, and the biassing means be arranged to convert the plurality of position responsive signals into a combination of biassed and unbiassed position responsive signals which are together representative of the position of the movable member according to the second position responsive code which is a binary code having a basic cycle of 10 adjacent ranges.

A read-out circuit for an electrical altitude encoder will now be described by way of example, with reference to the accompanying drawings, of which:

Figure 1:
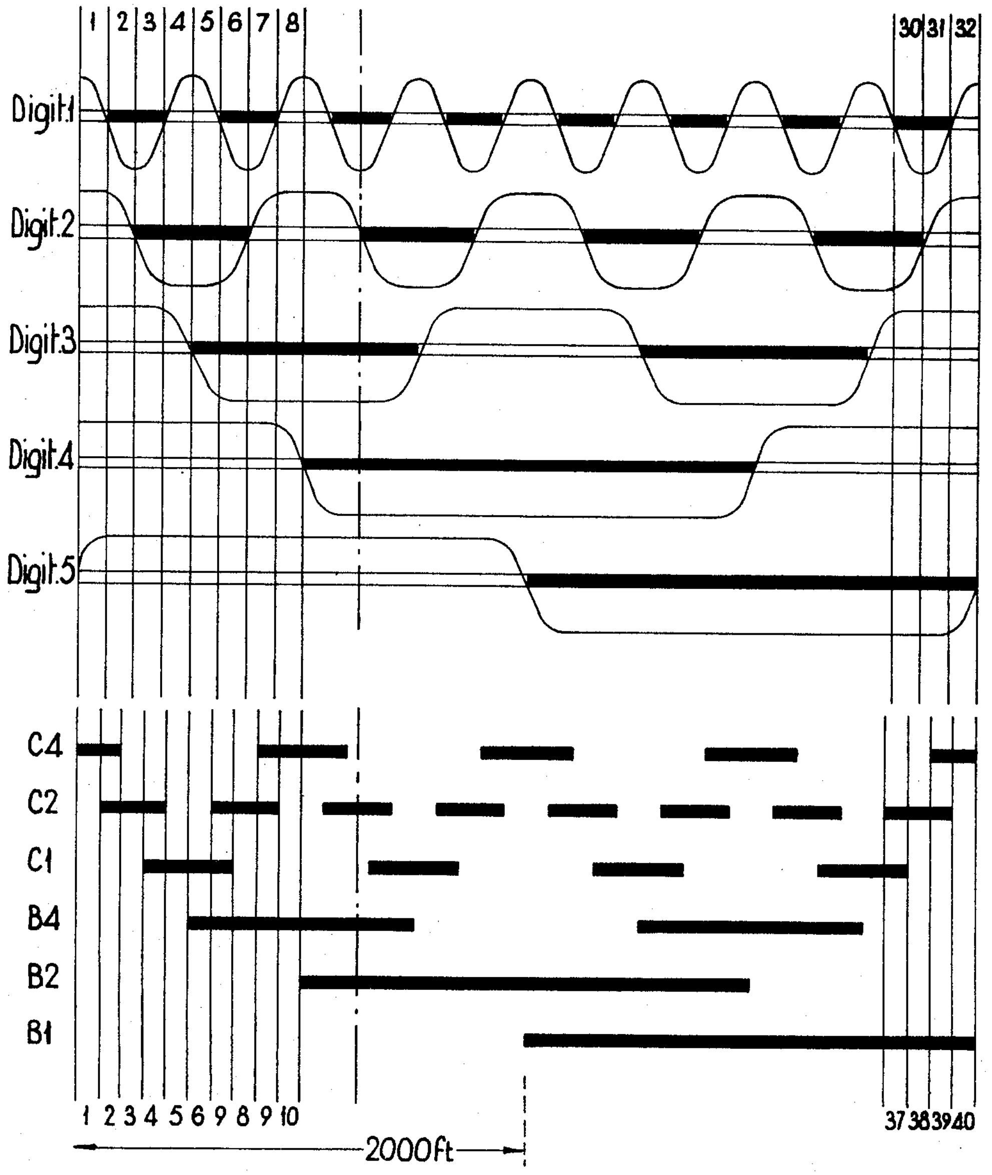
FIG. 1 shows two cyclic binary codes the upper one being a reflected binary code derived from a five-digit electrical position encoder and the lower one being part of a standard altitude code known as a Gillam code.

Referring to FIG. 1, the upper part shows five waveforms corresponding to the five output signals of a five-digit encoder such as is described in U.S. Pat. No. 3,099,830. Briefly, this encoder comprises a cylindrical ferromagnetic stator having 32 circumferential teeth, a primary and five secondary windings wound in and the teeth, of the teeth, and a U-shaped ferromagnetic rotor the arms of which extend parallel to the axis, one in an axial hole in the stator and the other completing a ferromagnetic path to a particular one of the teeth, the particular tooth being selected by the rotational position of the rotor.

The sense in which the primary winding is wound around the teeth provides a reference sense and each secondary winding is wound in this sense on certain teeth (half of the total) and in the opposite sense on the remainder. At least some of the teeth on which any one secondary winding is wound in the reference sense are different from those on which any other secondary winding is wound in the reference sense. The choice of reference sense teeth for each winding is such that each tooth has a unique combination of the designated five windings wound in the reference sense on that tooth. Therefore by applying a pulse or oscillatory signal to the primary winding there would be, in the absence of the rotor, relatively weak voltages of one sense induced in those parts of each winding on the Preference'sense teeth, and relatively weak voltages of the opposite sense induced in those parts of each winding on the remaining sixteen teeth. In each winding the two sets of opposite induced voltages cancel and the net result is zero output voltage on any secondary winding. The effect of the rotor is to enhance the coupling between the primary winding and all five secondary windings for those parts of the windings on the particular tooth at which the U-shaped rotor is set. This one-tooth coupling determines the resultant induced voltage in each winding, the sense of these output voltages being determined by the sense of the various windings on that tooth. The sense of the output voltages therefore characterizes the particular tooth and the position of the rotor.

The five waveforms shown in FIG. 1 represent the magnitude and sense of the output voltages on the five secondary windings with respect to the position of the rotor. The waveforms provide digital signals of increasing significance from the top down.

In use of the standard encoder a phase-sensitive or pulse-level detector may be employed to extract the reflected binary code which is shown superimposed on these waveforms. Any one of the thirty-two positions of the rotor can thus be identified by the resulting binary code word. Thus, for example, 01100 characterizes the position of the rotor at tooth nine.

In the present example it is required that an altitude range of 64,000 ft shall be encoded in steps of 100 feet. One standard five-digit encoder employing the reflected binary code will resolve down to 2,000 feet. A further five-digit-encoder coupled to the first by 32:1 gearing would provide further resolution down to 62.5 feet. It is, however, preferable that the degree of resolution of the least significant (L.S.) digit of the coarse encoder is duplicated by the most significant (M.S.) digit of the fine encoder. This duplication permits the transitions of the L.S. coarse encoder digit to be dictated by, and synchronised with, the transitions of the M.S. digit of the fine encoder. Ambiguity that might otherwise occur in the values of the L.S. coarse encoder digit and the M.S. .fine encoder digit, as a result of backlash in the gearing or other manufacturing tolerances, is thus eliminated.

The above "anti-ambiguity" feature is the subject of U.S. Pat. No. 3,197,758.

The above duplication does mean that there are only four further digits available for the fine resolution. 16:1 gearing is therefore used and the minimum altitude step that can be resolved becomes 125 feet. The necessary transitions at 100 feet intervals are still, therefore, not provided.

A standard code, known as the Gillam code, has been laid down which does provide code transitions at 100 ft and 500 ft intervals as required. The first least significant six digits of this code, which are known by the designations C4, C2, C1, B4, B2, B1, in increasing significance, are shown in the lower part of FIG. 1. The remaining four digits are designated A4, A2, A1 and D4. These are not shown but are obtained from that part of the Gillam code shown, by reflection about, first, the 40/41 transition line, then the 80/81 line, the 160/161 line and the 320/321 line, and identification of the image in each case by '1,' in the usual manner of a reflected code.

For convenience the code shown in the upper part of FIG. 1 will subsequently be referred to by its alternative name of 'Gray code.'

Comparing the Gray and Gillam codes of FIG. 1, it will be seen that the Gillam code C4 and C1 digits have the same 'frequency' that is, the same position repetition rate, as Digit 2 of the Gray code. Also, the Gilliam code C2 digit has the same positional repetition rate as Digit 1 of the Gray code.

This invention resides in the fact that, in this example the three L.S. Gillam code digits C4, C2 and C1 (i.e. those which do not follow the standard Gray code and do not have a 1:1 'mark/space ratio) can be obtained from the standard Gray encoder without upsetting the basically self-cancelling arrangement of each secondary winding (resulting from the 1:1 'mark/space ratio).

Figure 2:
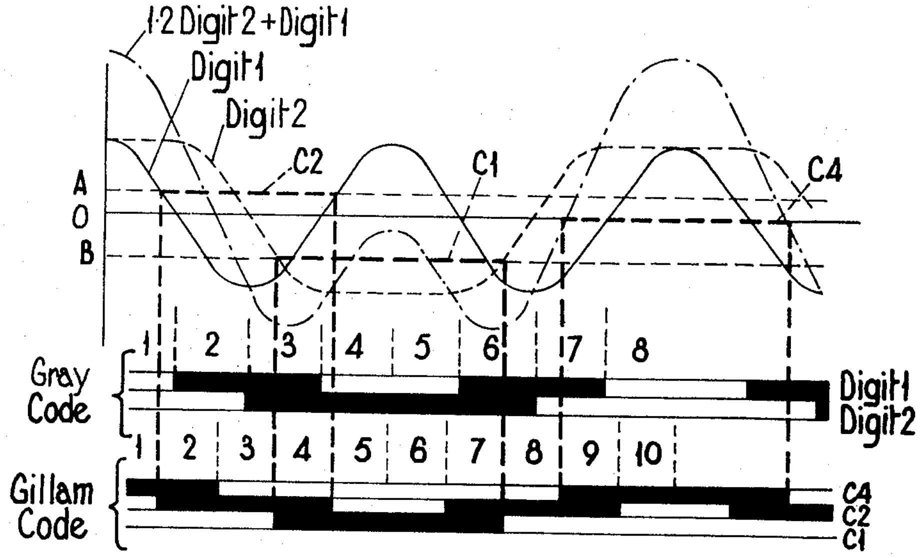
FIG. 2 shows corresponding detail parts of the two codes.

Referring now to FIG. 2, the manner in which the three Gillam code digits C4, C2 and C1 are obtained from the Gray code Digit 1 and Digit 2, will be explained. This figure shows the available Gray code and the desired Gillam code for the first twelve or so position ranges of each.

The zero transitions of the Digit 2 waveform are made to coincide with the C4 transitions by biassing the Digit 2 waveform negatively. This is achieved by adding to it the Digit 1 waveform in the proportion 1.2 Digit 2 : 1 Digit 1 The chain dotted line shows the result.

The digital patterns shown are representative of signals positive and negative with respect to a datum, black indicating the negative sense and white the positive sense. Thus, although the added Digit 1/Digit 2 signal has zero transitions at the correct incidence it is inverted with respect to a signal that would produce the C4 pattern on the above basis. The necessary inversion of the Digit 1/Digit 2 waveform is effected in the read-out circuit, as will be explained.

The Gillam code C1 digit is also obtained from the Gray Digit 2 but in this case by D.C. biassing of the waveform. A positive bias is added to the signal to lower the decision level to the line B. The zero transitions of the biassed Digit 2 signal then occur at the required position and the sense of the signal is as required.

The Gillam digit C2 is obtained from the Digit 1 waveform by negative biassing to raise the decision level to the line A. The sense of the biassed Digit 1 signal is seen to be correct.

The remaining Gillam code digits B4, B2, B1, A4, A2, A1 and D4 are identical to the Gray code digits and can be derived directly from the digitizer secondary windings by decision circuits.

Figure 3:
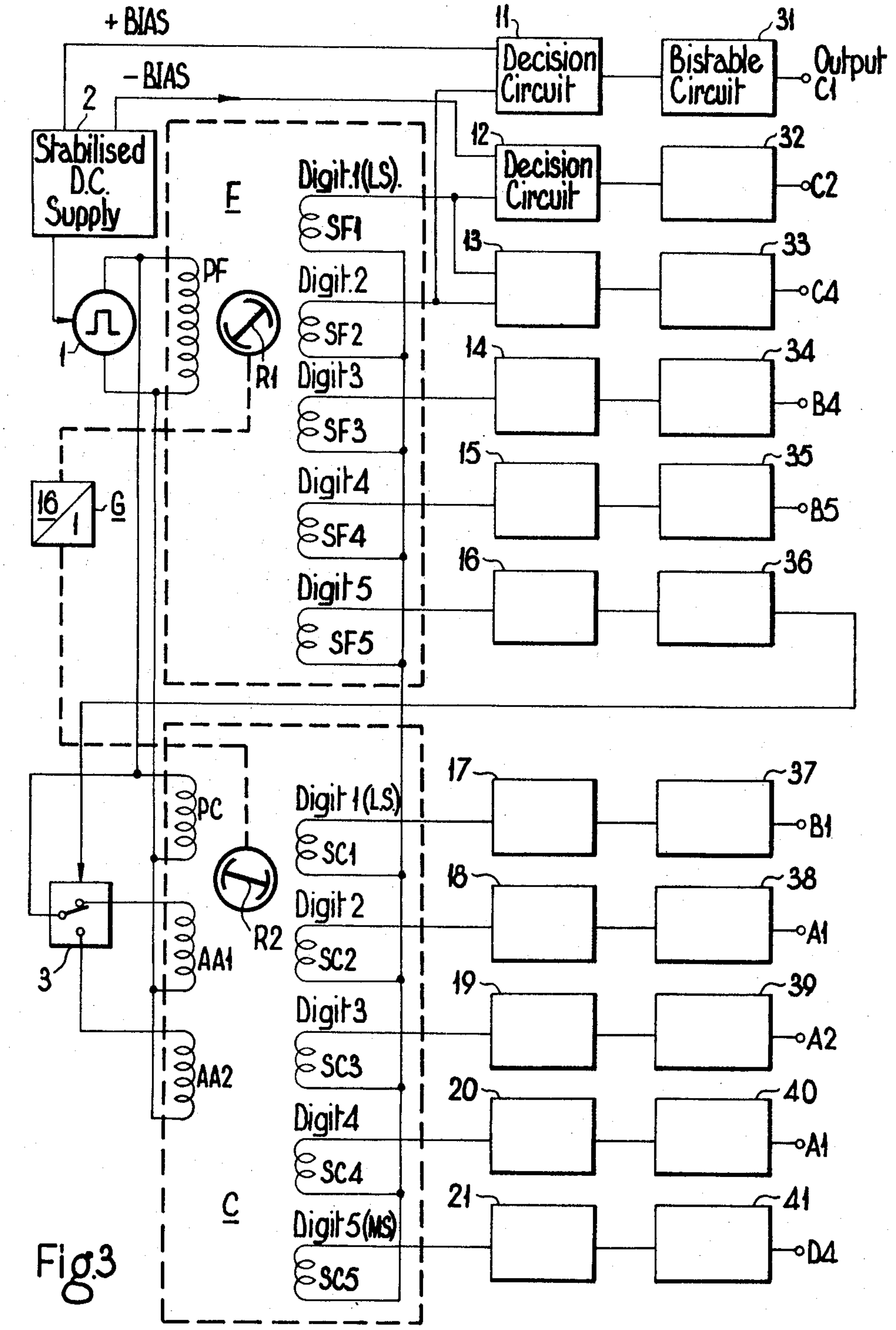
FIG. 3 is a schematic circuit diagram of a fine/coarse encoder arrangement from which is derived the whole of the Gillam code.

Referring not to FIG. 3, this shows a coarse/fine encoder arrangement basically as described in U.S. Pat. No. 3,197,758.

Two five-digit encoders F & C (fine and coarse) are coupled together by mechanical gearing G so that the rotor R1 of the fine encoder F makes 16 revolutions for one revolution of the rotor R2 of the coarse encoder C.

The primary windings PF and PC of the two encoders are energised by a pulse signal having a pulse repetition rate in the region of 20–100 pulses per second derived from a pulse generator 1. The pulse generator is driven by a D.C. supply 2.

Two additional windings AA1 and AA2 are employed on the coarse encoder, these being wound in the same sense as the primary winding PC, the winding AA1 on the odd-numbered teeth only and the winding AA2 on the even-numbered teeth only. The two windings AA1 and AA2 are connected alternatively in parallel with the main primary winding P.C. by means of switching circuitry shown diagrammatically and referenced 3. The effect of these windings is that the flux in one or the other set of alternate teeth is increased so that each range transition of the rotor R2 between adjacent teeth, and at which the output code would change, is effectively biassed off the geometric transition. The direction of the bias is determined by the switching circuitry 3 which is in turn controlled by the M.S. digit of the fine encoder F. As mentioned above, the L.S. digit of the coarse encoder C is duplicated by the M.S. digit of the fine encoder F. Therefore the above bias of the range of influence of the two sets of alternate teeth is changed in direction, by a change of the fine encoder M.S. digit, at exactly the position of the coarse encoder rotor R2 at which a change of the coarse encoder L.S. digit would occur if there were no backlash in the gearing G and no bias. The L.S. digit of the coarse encoder C is determined, in the region of a transition by the bias and therefore a change of the L.S. digit of the coarse encoder C is synchronized with the change in the M.S. fine encoder digit. No ambiguity therefore results.

Reverting to the derivation of the Gillam code digits, the output of the least significant, fine encoder secondary winding SF1 is applied to a decision circuit 12 which is a transistor biassed so as to conduct or not according to whether the applied pulse output signal is positive or negative with respect to the bias line A in FIG. 2. The bias signal is a positive D.C. signal and is applied to the emitter of the transistor while the pulse output signal is applied to the base electrode. In this particular decision circuit 12, two further transistors follow the basic one to adjust the output voltage levels.

The second secondary winding SF2 of the fine encoder F applies a pulse output signal to a decision circuit 13 which comprises a single transistor. The pulse output signal is applied to the base electrode of the transistor by way of a resistor, and a biassing pulse signal derived from winding SF1 is added to this by way of a further resistor. The resistors are in the ratio 1.2:1 to provide the chain dotted waveform of FIG. 2 and the transistor conducts or not according to whether the combined input is positive or negative.

A further pulse output signal is derived from the secondary winding SF2 of the fine encoder F and this is applied to a decision circuit 11. This circuit 11 comprises a single transistor which is biassed to conduct or not according to whether the pulse output signal from winding SF2 is positive or negative with respect to the bias line B of FIG. 2. Both the pulse output signal and the (positive) bias signal are applied to the base electrode of the single transistor of the decision circuit 11.

The bias signals applied to the decision circuits 11 and 12 are in fact the same signal, the required difference in their polarity being met by the application of one to the base electrode and one to the emitter electrode of the transistors of the respective decision circuits.

Furthermore, these D.C. bias signals are derived from the D.C. supply 2 so that any variation of the pulse signal levels tends to be compensated by a corresponding variation of the bias level.

Decision circuits 14-21 accommodate the remaining secondary windings SF3 -SC5, no essential biassing being involved in these circuits.

The output signal of each decision circuit is a pulse signal of either zero or predetermined positive amplitude according to the decision. Each such signal is applied to a respective bistable circuit 31-41 to staticize the result until the next decision. The bistable circuits are triggered by a pulse signal (connection not shown) derived from the pulse generator 1 but of narrower pulse form and occurring within the pulse durations of the signals from the decision circuits.

The successive sense inversions throughout the circuit from the pulse generator 1 to the bistable circuits are such that the inverse output from each bistable provides the final output signal, with the exception of bistable circuit 32 from which the normal output compensates for an extra inversion in the special decision circuit 12, and bistable circuit 33, the normal output of which effectively provides the necessary inversion of the C4 waveform of FIG. 2.

In operation an altitude transducer is coupled to the rotors of the two encoders so that the zero altitude condition of the transducer coincides with the center of the thirteenth Gillam range of the fine encoder thus providing an altitude scale commencing at −1,250 feet. The altitude zero is also arranged to fall in the first 2,000 ft. range of the coarse encoder, that is, in the first of the 32 ranges of the coarse encoder. Zero altitude is thus encoded as 0000011010.

An alternative biassing arrangement for obtaining the Gillam code C1 and C4 digits employs a transformer having a center tapped secondary winding. Each half of the secondary has a winding ratio with the primary of 0.833:1. The Digit 1 signal from the fine encoder is applied to the primary winding of the transformer and the Digit 2 signal is applied to the center tap of the secondary winding. The ends of the secondary winding then provide signals which are respectively Digit 2 + 0.833 Digit 1 and Digit 2 − 0.833 Digit 1. From FIG. 2 it can be seen that the first of these will provide (after inversion) the Gillam code digit C4, and the second will provide the Gillam code digit C1, with suitable decision circuits. C2 is derived as before, by DC biassing.

In an alternative embodiment of the invention, a sinusoidal signal is used to drive the encoders. In this case a phase-sensitive detector is used to detect the sense of each output signal of the digitizers, followed by a bistable memory store. The bias in this case is derived either from the sinusoidal drive signal of the encoders or, again, from a suitable one of the sinusoidal encoder output signals.

The present invention enables a standard encoder to provide the Gillam code, each of the three least significant digits of which are inherently unbalanced and could not easily be produced by simple re-arrangement of the winding senses on appropriate teeth of the encoder stator of the above example.

I claim:

1. An electrical position encoder comprising:

a. a movable member;

b. means for deriving from said member a plurality of position-responsive signals having values which fluctuate alternately positively and negatively with respect to respective intermediate values as functions of position of the movable member, i. the positional extents of the positive and negative fluctuations of said signals being in respective predetermined ratios, ii. the combination of polarities of said position-responsive signals with respect to their respective said intermediate values at any given time being characteristic, according to a first binary position code, of the particular one of a plurality of adjacent ranges of position occupied by said movable member at that time;

c. a plurality of signal paths to which said position responsive signals are respectively applied; and d. a plurality of decision circuits each connected to a respective one of said signal paths to produce a binary output signal comprising a mark or a space according to the instantaneous value of the position-responsive signal applied to the corresponding said path, relative to a decision level;

e. the positional extents of the marks and spaces of at least one of said binary output signals being in a mark/space ratio which differs from said predetermined ratio of the positive and negative fluctuations of the corresponding position-responsive signal, f. whereby the combination of the values of said binary output signals, at any given time is characteristic, according to a second binary position code, of the particular one of a different plurality of adjacent ranges of position that is occupied by said member at that time.

2. An electrical position encoder according to claim 1 including biasing means in respect of at least one of said decision circuits to apply a bias signal to that decision circuit to bias the associated position-responsive signal relative to the decision level of that decision circuit.

3. An electrical position encoder according to claim 2 wherein said biasing means derives said bias signal from one of said signal paths associated with another of said decision circuits.

4. An electrical position encoder according to claim 2 wherein said bias signal is a D.C. signal.

5. An electrical position encoder according to claim 1 including a plurality of bistable circuits respectively responsive to said binary output signals from the decision circuits to staticize the decisions of the decision circuits.

6. An electrical position encoder according to claim 1 wherein said first position code is a reflected binary code.

7. An electrical position encoder according to claim 6 wherein the number of said adjacent ranges corresponding to said first position code is equal to a power of two, and the number of said adjacent ranges corresponding to said second position code is equal to a multiple of 10.

* * * * *